(12) United States Patent
Liu et al.

(10) Patent No.: US 7,427,784 B2
(45) Date of Patent: Sep. 23, 2008

(54) COB-TYPED LED PACKAGE WITH PHOSPHOR

(75) Inventors: Chia-Chi Liu, His Chih (TW); Wei-Yuan Cheng, His Chih (TW)

(73) Assignee: Lustrous Technology Ltd., Taipei (TW)

( * ) Notice: Subject to any disclaimer, the term of this patent is extended or adjusted under 35 U.S.C. 154(b) by 188 days.

(21) Appl. No.: 11/495,687

(22) Filed: Jul. 31, 2006

(65) Prior Publication Data

US 2007/0090389 A1    Apr. 26, 2007

(30) Foreign Application Priority Data

Oct. 26, 2005    (TW) .................... 94137397

(51) Int. Cl.
| | |
|---|---|
| *H01L 29/22* | (2006.01) |
| *H01L 33/00* | (2006.01) |
| *H01L 29/24* | (2006.01) |
| *H01L 27/15* | (2006.01) |
| *H01L 29/267* | (2006.01) |
| *H01L 31/12* | (2006.01) |
| *H01L 29/16* | (2006.01) |
| *H01L 31/0203* | (2006.01) |
| *H01L 23/02* | (2006.01) |

(52) U.S. Cl. .................... 257/99; 257/81; 257/82; 257/100; 257/433; 257/434; 257/680

(58) Field of Classification Search ............. 257/81–82, 257/99–100, 433–434, 680
See application file for complete search history.

(56) References Cited

U.S. PATENT DOCUMENTS

| | | | | |
|---|---|---|---|---|
| 6,953,952 | B2 * | 10/2005 | Asakawa | 257/103 |
| 7,045,905 | B2 * | 5/2006 | Nakashima | 257/787 |
| 2005/0093146 | A1 * | 5/2005 | Sakano | 257/730 |
| 2006/0038477 | A1 * | 2/2006 | Tamaki et al. | 313/485 |
| 2007/0252513 | A1 * | 11/2007 | Justel et al. | 313/503 |

* cited by examiner

*Primary Examiner*—Ida M Soward
(74) *Attorney, Agent, or Firm*—Troxell Law Office, PLLC

(57) ABSTRACT

A light emitting diode (LED) package unit, including a substrate having a concave, a LED chip, at least two electrodes, at least two wires, a gel and a first wavelength-converting material. The LED chip, disposed in the concave, including a top-face, a bottom-face for jointing with the substrate, and at least two chip-electrodes. The LED chip emits light of a first wavelength. The electrodes are disposed on the substrate. The wires are respectively connecting one of the chip-electrode with one of the electrode. The gel is disposed to seal the LED chip and the wires. The first wavelength-converting material including Sr—Si—O—N:Eu is doped within the gel. The first wavelength-converting material absorbs light of the first wavelength and emits light of a second wavelength longer than the first wavelength.

12 Claims, 3 Drawing Sheets

COB-TYPED LED PACKAGE WITH PHOSPHOR

BACKGROUND OF THE INVENTION (1) Field of the Invention

The invention relates generally to a package structure of a light emitting diode (LED) device, and particularly to a chip-on-board (COB)-typed LED package with specific phosphors.

(2) Description of the Prior Art

LEDs are now widely used as illuminators, indicators or displays in many kinds of electronic products or industrial applications. One of the advantages of LEDs is that they consume much less electricity, or energy, as comparing with other traditional lighting devices. This is because that LEDs are known as solid state devices that generate light through a luminescence process. Thus the light generated by LEDs is referred to "cold light". Besides, another advantage of LEDs is its small size. An LED are provided as a semiconductor chip. Hence, LEDs can meet the size-reducing requirement of modern electronic products, especially the delicate electronic products.

LEDs based on the III-nitride materials system have been developed that can efficiently emit light in a relatively narrow band around a peak wavelength in the blue to UV range of the spectrum. Since blue-UV light has a higher photo energy relative to other colors of visible light, such light generated by III-nitride LED is convenient for converting to those other colors of visible light by coating specific wavelength-converting material, such as a phosphor.

While the LED chip applied in an electronic device, it needs to be packaged in a LED package unit, which comprises electrodes for facilitating follow-up fabrication processes. In the LED package unit, the LED chip is usually sealed with a gel material. And a wavelength-converting material, is usually doped within the gel, is usually utilized to convert light of a first wavelength, which is generated from the LED chip, to light of a second wavelength.

A prior single chip, white-light LED package unit incorporates a yttrium-aluminum garnet (YAG) phosphor. Essentially, the phosphor layer produces white light (the second wavelength) from blue light (the first wavelength). The LED package unit is comprised of a blue-light LED chip that is located on a substrate, which is inside an organic YAG phosphor. The YAG phosphor is generally yellow and includes $Y_3Al_5O_{12}$:Ce or/and derivatives. Another prior single chip, white-light LED package unit incorporates a terbium-aluminum garnet (TAG) phosphor includes $Tb_3Al_5O_{12}$:Ce or/and derivatives. The TAG phosphor is generally a red and green hybrid phosphor.

Comparatively, the LED package unit incorporating TAG phosphor is difficult to achieve high power because of the material property. The LED package unit incorporating YAG phosphor is capable of generating light at high power, but the primary drawback is that the generated light often referred to a kind of "uncomfortable white". Accordingly, there are different "whites", "warm whites" and "cold whites" being the most common description. Scientifically, all chromaticies corresponding to black body spectra making up the Planckian locus are "whites". The white light generated through the YAG phosphor is hard to adjust its color temperature. Not only uncomfortable to the human eyes, it is even not capable of passing some specific standards, such as the product safety standard of the medical field or the traffic safety field.

SUMMARY OF THE INVENTION

Accordingly, one objective of the present invention is to provide a high power LED package unit.

Another objective of the present invention is to provide a LED package unit capable of generating comfortable white light.

Another objective of the present invention is to provide a LED package unit capable of passing various kinds of product safety standards.

A light emitting diode (LED) package unit comprising a substrate, a LED chip, at least two electrodes, at least two wires, a hybrid wavelength-converting layer and a gel, is provided. The substrate has a concave. The LED chip is disposed in the concave. The LED chip comprises a top-face, a bottom-face for jointing with the substrate, and at least two chip-electrodes disposed on the top-face. The LED chip emits light of a first wavelength.

The at least two electrodes is disposed on the substrate. The at least two wires respectively connects one of the chip-electrode with one of the electrode. The gel is disposed to seal the LED chip and the at least two wires. The hybrid wavelength-converting layer, at least covering the top-face of the LED chip, comprises a first wavelength-converting material and a second wavelength-converting material. The first wavelength-converting material comprises Sr—Si—O—N:Eu; and the second wavelength-converting material comprises Sr—Si—O—N(Cl):Eu.

The first wavelength-converting material absorbs light of the first wavelength and emits light of a second wavelength longer than the first wavelength. The second wavelength-converting material absorbs light of the first wavelength and emits light of a third wavelength longer than the first wavelength.

The advantage and spirit of the invention may be understood by the following recitations together with the appended drawings.

BRIEF DESCRIPTION OF THE DRAWINGS

The present invention will now be specified with reference to its preferred embodiment illustrated in the drawings, in which.

DESCRIPTION OF THE PREFERRED EMBODIMENT

Figure 1:
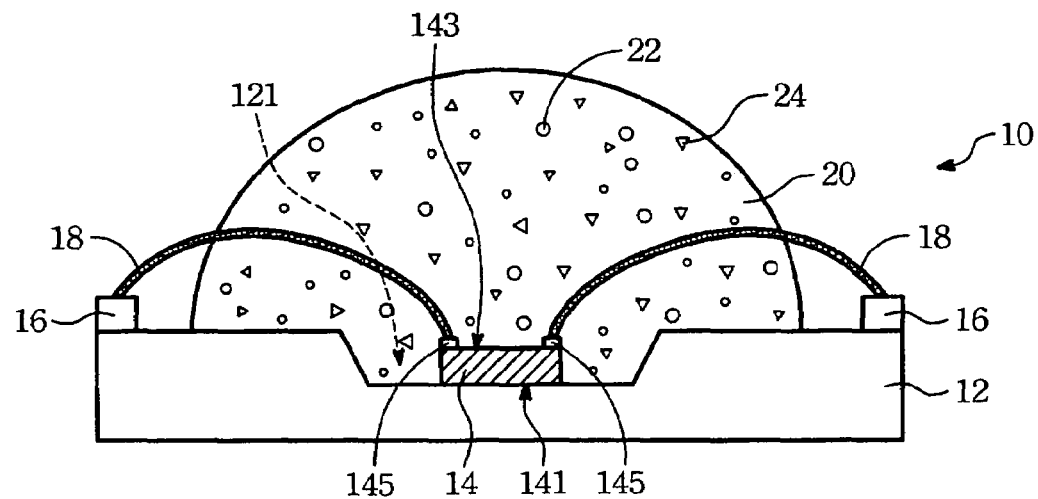
FIG. 1 shows a cross section view of the present LED package unit.

Please refer to FIG. 1. FIG. 1 shows a cross section view of the present LED package unit. The LED package unit comprising a substrate 12, a LED chip 14, at least two electrodes 16, at least two wires 18, a gel 20, a first wavelength-converting material 22 and a second wavelength-converting material 24. The substrate 12, such as a thin metal plate, has a concave 121 for containing the LED chip 14.

The LED chip 14, which is disposed in the concave 121, comprises a top-face 143, a bottom-face 141 for jointing with the substrate 12, and at least two chip-electrodes 145 disposed on the top-face 143. While conducted with electric current, the LED chip 14 emits light of a first wavelength.

The at least two electrodes 16 is disposed on the substrate 12, and preferably they are disposed in the margin area of one face of the substrate 12 that containing the LED chip 14. The at least two wires respectively connects one of the chip-electrode 145 with one of the electrode 16.

The gel 20, a silicon gel for some present embodiments, is disposed to seal the LED chip 14 and the at least two wires 18. The gel 20 protects the LED chip 14 from damage caused by static electricity, moisture, and other environmental influences.

The first wavelength-converting material 22 is doped within the gel 20, the first wavelength-converting material 22 comprising Sr—Si—O—N:Eu, a strontium europium silicon oxynitride compound. The first wavelength-converting material 22 absorbs light of the first wavelength, which is generated from the LED chip 14, and emits light of a second wavelength longer than the first wavelength through a electro-luminescence reaction such as fluorescence or phosphorescence.

Figure 2:
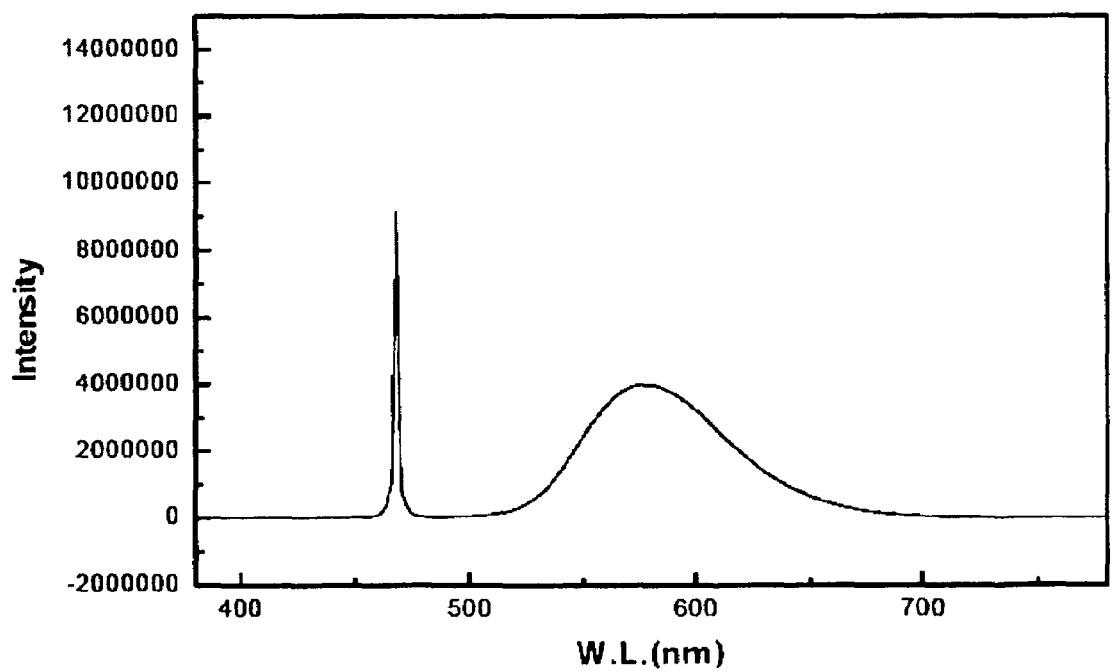
FIG. 2 shows an optical spectrum corresponding to the first wavelength-converting material.

According to the embodiments of the present invention, the first wavelength ranges from 300 nm to 490 nm. Substantially, light of the first wavelength is blue light to ultraviolet (UV) light. Comparing to most portions of the visible light, light of the first wavelength has relatively high energy. So light of the second wavelength, which belongs to a kind of visible light, can be readily generated by the first wavelength-converting material 22 exited by light of the first wavelength. The second wavelength ranges from 550 nm to 630 nm. Light of the second wavelength is substantially orange. FIG. 2 shows a optical spectrum corresponding to the first wavelength-converting material 22.

Figure 3:
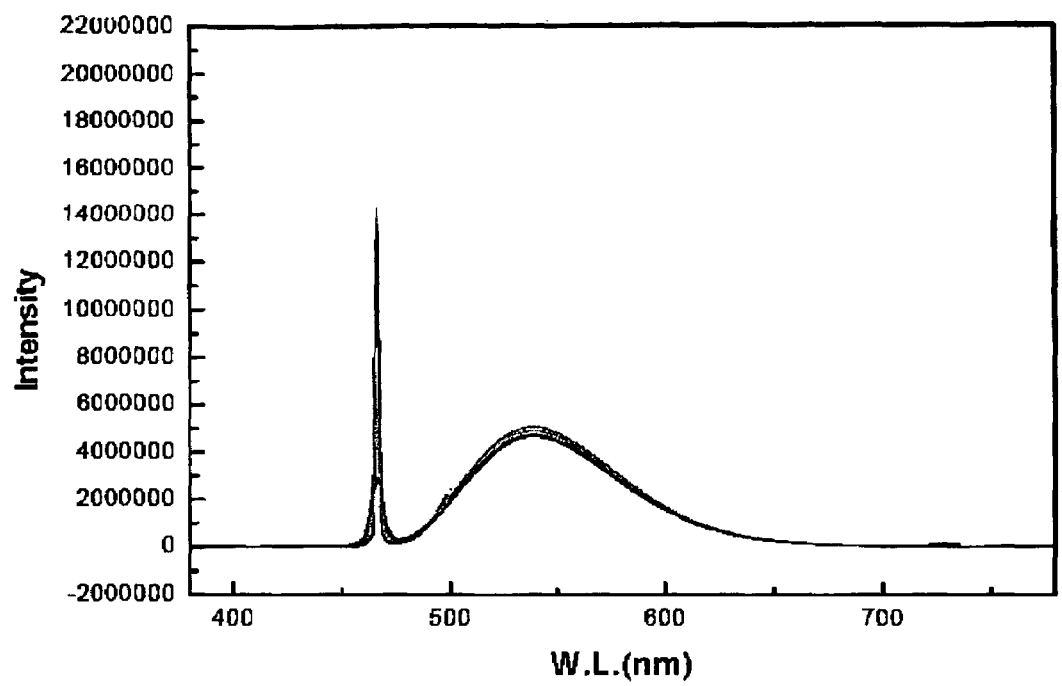
FIG. 3 shows an optical spectrum corresponding to the second wavelength-converting material.

The second wavelength-converting material 24 is doped within the gel 20, the second wavelength-converting material 24 comprising Sr—Si—O—N(Cl):Eu, a strontium europium silicon chlorooxynitride compound. The second wavelength-converting material 24 absorbs light of the first wavelength and emits light of a third wavelength longer than the first wavelength through a electro-luminescence reaction such as fluorescence or phosphorescence. The third wavelength ranges from 500 nm to 580 nm. Light of the third wavelength is substantially green. FIG. 3 shows a optical spectrum corresponding to the second wavelength-converting material 24.

Figure 4:
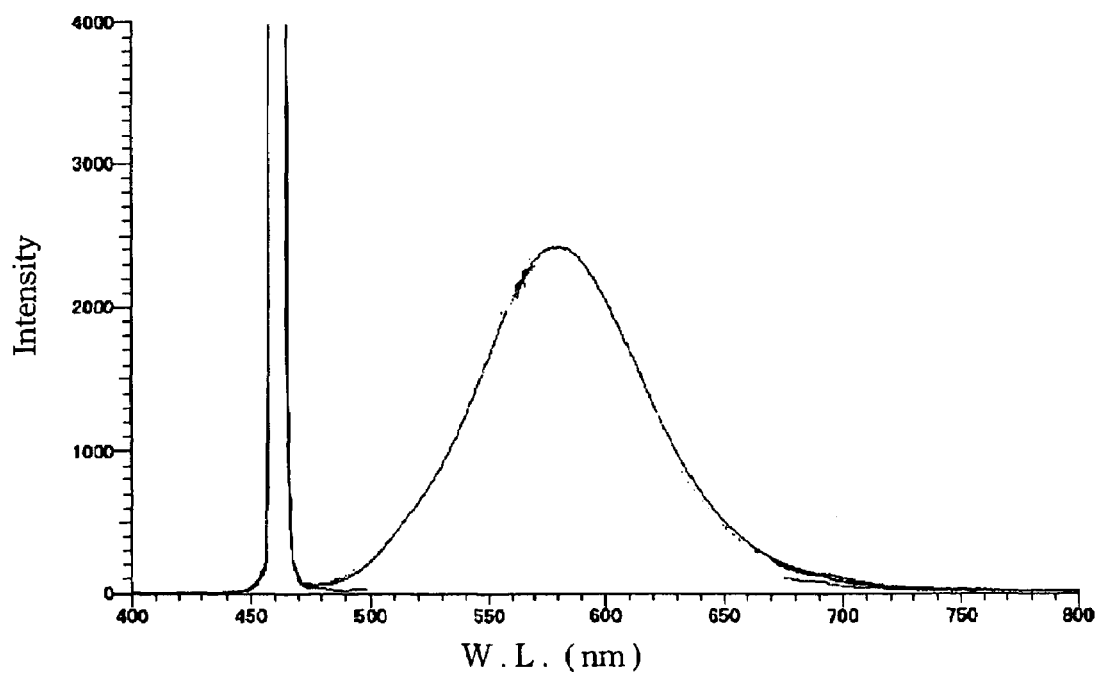
FIG. 4 shows the hybrid spectrum corresponding to the first wavelength-converting material and the second wavelength-converting material.

Through the mixed first wavelength-converting material 22 and second wavelength-converting material 24, the present LED package unit is capable of generating high power white light. FIG. 4 shows the hybrid spectrum corresponding to the first wavelength-converting material 22 and second wavelength-converting material 24.

In the aspect of optical performance, through observation, white light is readily generated by the mixed first wavelength-converting material 22 and second wavelength-converting material 24 cooperated with the lighting LED chip 14. A more "warm" white light than the prior art of the YAG phosphor is generated. In one of the present embodiments, a generated white light having a color temperature of 2800 K is observed. Accordingly, to human eyes, the present invention is capable of providing a more comfortable white light. Further more, by controlling the mixing ratio of the first wavelength-converting material 22 and the second wavelength-converting material 24, light of different white is derivable.

In the aspect of power performance, under the substantially equal providing electricity, the present LED package unit has a light intensity capable of reaching 90% of the prior art of YAG phosphor. Therefore, the present invention is suitable for applying in high power lighting product.

In the aspect of structure, the present invention adopts the chip on board (COB) type package structure. Comparing with the other prior arts, such as the leadframe package or other package structures, the present LED package unit 10 has a thermal resistant about 15 to 17 C/W; while the thermal resistant of the prior arts is usually above 20 C/W. Hence, the advantage of heat sinking ability is obvious.

Concerning to an annual ring that might be caused by the present COB-typed package structure, another embodiment of the present invention is provided. The probable explanation to the annual ring might relate to the mixed first wavelength-converting material 22 and second wavelength-converting material 24 that doped in the gel 20. As shown in FIG. 1, the mixed first wavelength-converting material 22 and second wavelength-converting material 24 are spread evenly in the gel 20. But comparing to the top-face 143 of the LED chip 14, the side portion of the LED chip 14 generates light of a relatively weak intensity.

Figure 5:
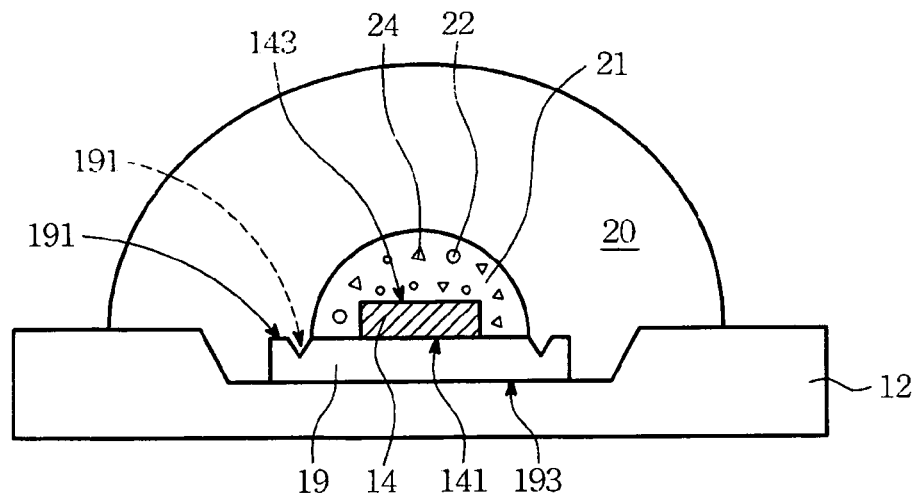
FIG. 5 shows a cross section view of the present LED package unit according to another embodiment.

Thus, another embodiment according to FIG. 5 is provided. In this embodiment, the LED package unit 10 further comprises a silicon adapter 19. The silicon adapter 19 comprising a first-face 195 and a second face 193. The first-face 195 is for jointing with the bottom-face 141 of the LED chip 14. The second-face 193 is for jointing with the substrate 12. One function of the silicon adapter 19 is to provide a more flat surface for mounting the LED chip 14. Because the concave 121 of the substrate is substantially formed by a punching mechanism, the surface of the substrate 12 in the concave 121 somehow becomes a roughness surface, which is not only difficult for mounting the LED chip 14, but also causing the LED chip 14 broken while mounting. As a result, the silicon adapter 19 is capable of resolving the mentioned problems.

Figure 6:
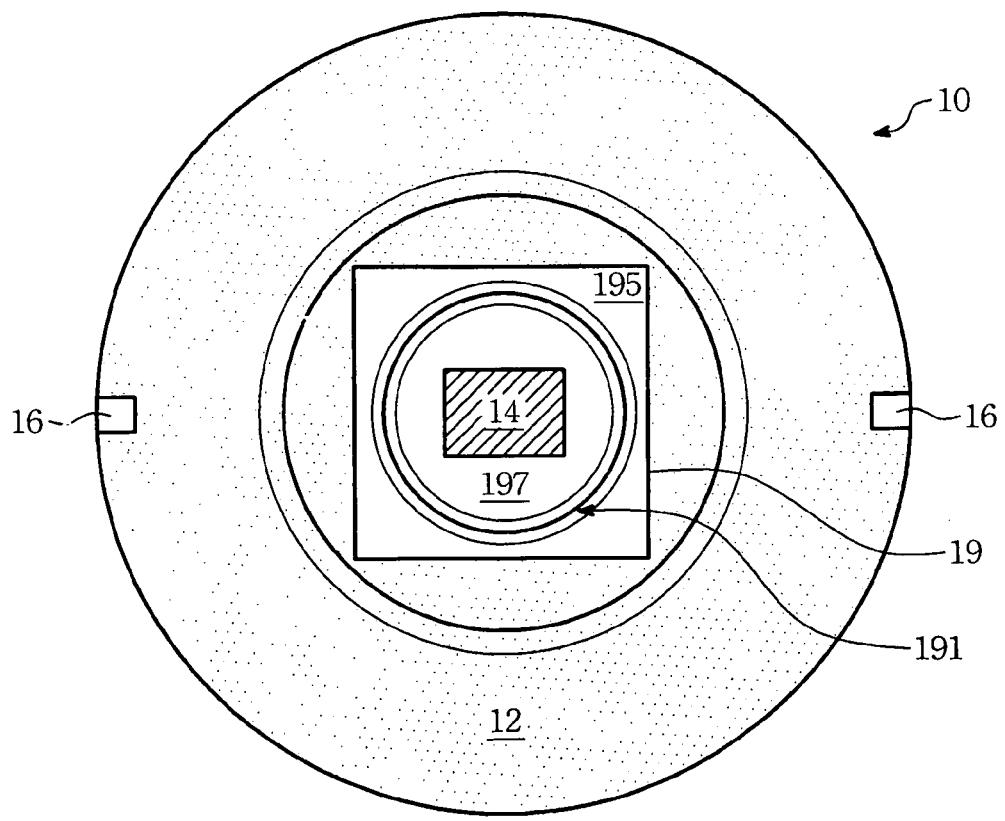
FIG. 6 is a top view of the LED package structure according to FIG. 5.

Another function of the silicon-adapter 19 is that a hybrid wavelength-converting layer 21 can be readily formed utilizing a trench structure 191 of the silicon adapter 19. As shown in FIG. 5, the silicon adapter 19 further comprises the trench structure 191 formed on the first-face 195. The trench structure 191 is disposed to enclose a predetermined area 197 that containing the LED chip 14, as shown in FIG. 6, which is a top view of the LED package structure according to FIG. 5. A surface tension force at an edge 198 between the trench structure 191 and the first-face 195 capable of orientating the hybrid wavelength-converting layer 21 within the predetermined area 197.

The hybrid wavelength-converting layer 21 at least covering the top-face 143 of the LED chip 14 comprising the first wavelength-converting material 22 and the second wavelength-converting material 24. In this embodiment, the first wavelength-converting material 22 and the second wavelength-converting material 24 are no more spread in the whole gel 20, but only forming a film layer to cover the LED chip 14. While fabricating, the first wavelength-converting material 22 and the second wavelength-converting material 24 is mixed with a gel material such as a silicon gel to drop onto the LED chip 14. Through the trench structure 191, not only the dropping hybrid wavelength-converting layer 21 is limited in the predetermined area 197, but a curvature of the hybrid wavelength-converting layer 21 is able to be adjusted by controlling the dropping amount. While observing the light generated by the LED package unit 10 according to this embodiment, the annual ring problem is substantially resolved. A clear white light is thus provided.

Accordingly, through all the mentioned embodiments according to the present invention, a high power LED package unit is provided. Meanwhile, the present LED package unit is capable of generating a more comfortable white light and capable of passing various kinds of product safety standards, such as the product safety standard of the medical field or the traffic safety field. The heat sinking ability of the present invention is another remarkable advantage. Moreover, the present invention resolves the annual ring problem in a COB-typed package structure.

While the preferred embodiments of the present invention have been set forth for the purpose of disclosure, modifications of the disclosed embodiments of the present invention as well as other embodiments thereof may occur to those skilled in the art. Accordingly, the appended claims are intended to cover all embodiments which do not depart from the spirit and scope of the present invention.

The invention claimed is:

1. A light emitting diode (LED) package unit, comprising:
a substrate, having a concave;
a LED chip, disposed in the concave, the LED chip comprising a top-face, a bottom-face for jointing with the substrate, and at least two chip-electrodes disposed on the top-face, the LED chip emitting light of a first wavelength;
at least two electrodes, disposed on the substrate;
at least two wires, respectively connecting one of said chip-electrode with one of said electrode;
a gel, disposed to seal the LED chip and said at least two wires; and
a first wavelength-converting material, doped within the gel, the first wavelength-converting material comprising Sr—Si—O—N:Eu,
wherein the first wavelength-converting material absorbs light of the first wavelength and emits light of a second wavelength longer than the first wavelength.

2. The LED package unit according to claim 1 further comprising a second wavelength-converting material, doped within the gel, the second wavelength-converting material comprising Sr—Si—O—N(Cl):Eu.

3. The LED package unit according to claim 2, wherein the second wavelength-converting material absorbs light of the first wavelength and emits light of a third wavelength longer than the first wavelength.

4. The LED package unit according to claim 1, wherein the first wavelength ranges from 300 nm to 490 nm (blue to UV).

5. The LED package unit according to claim 1, wherein the second wavelength ranges from 550 nm to 630 nm (orange).

6. The LED package unit according to claim 3, wherein the third wavelength ranges from 500 nm to 580 nm (green).

7. A light emitting diode (LED) package unit, comprising:
a substrate, having a concave;
a LED chip, disposed in the concave, the LED chip comprising a top-face, a bottom-face for jointing with the substrate, and at least two chip-electrodes disposed on the top-face, the LED chip emitting light of a first wavelength;
at least two electrodes, disposed on the substrate;
at least two wires, respectively connecting one of said chip-electrode with one of said electrode;
a hybrid wavelength-converting layer, at least covering the top-face of the LED chip, the hybrid wavelength-converting layer comprising:
a first wavelength-converting material, comprising Sr—Si—O—N:Eu;
a second wavelength-converting material, comprising Sr—Si—O—N(Cl):Eu; and
a gel, disposed to seal the LED chip and said at least two wires,
wherein the first wavelength-converting material absorbs light of the first wavelength and emits light of a second wavelength longer than the first wavelength,
wherein the second wavelength-converting material absorbs light of the first wavelength and emits light of a third wavelength longer than the first wavelength.

8. The LED package unit according to claim 7, wherein the first wavelength ranges from 300 nm to 490 nm (blue to UV).

9. The LED package unit according to claim 7, wherein the second wavelength ranges from 550 nm to 630 nm (orange).

10. The LED package unit according to claim 7, wherein the third wavelength ranges from 500 nm to 580 nm (green).

11. The LED package unit according to claim 7 further comprising a silicon adapter comprising a first-face for jointing with the bottom-face of the LED chip, and a second-face for jointing with the substrate.

12. The LED package unit according to claim 11, wherein the silicon adapter further comprises a trench structure formed on the first-face and disposed to enclose a predetermined area that containing the LED chip, a surface tension force at an edge between the trench structure and the first-face capable of orientating the hybrid wavelength-converting layer within the predetermined area.

* * * * *